(12) United States Patent
Nakanishi

(10) Patent No.: US 7,782,690 B2
(45) Date of Patent: Aug. 24, 2010

(54) MEMORY CONTROL CIRCUIT AND SEMICONDUCTOR DEVICE

(75) Inventor: Hiroaki Nakanishi, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 152 days.

(21) Appl. No.: 12/234,076

(22) Filed: Sep. 19, 2008

(65) Prior Publication Data

US 2009/0080274 A1    Mar. 26, 2009

(30) Foreign Application Priority Data

Sep. 20, 2007   (JP) .............................. 2007-243341

(51) Int. Cl.
*G11C 7/00* (2006.01)
(52) U.S. Cl. .......................... 365/201; 365/78; 713/100
(58) Field of Classification Search ..................... 365/78
See application file for complete search history.

(56) References Cited

U.S. PATENT DOCUMENTS

| 5,959,883 | A | 9/1999 | Brennan, Jr. et al. |
| 6,075,267 | A | 6/2000 | Taji et al. |
| 6,115,292 | A | 9/2000 | Fukuda et al. |
| 6,335,883 | B1 | 1/2002 | Fukuda et al. |
| 6,545,916 | B2 | 4/2003 | Fukuda et al. |
| 6,643,193 | B2 * | 11/2003 | Yamaki et al. ......... 365/189.09 |
| 6,949,790 | B2 | 9/2005 | Iwai et al. |
| 6,952,035 | B2 | 10/2005 | Yoshida et al. |
| 7,314,797 | B2 | 1/2008 | Iwai et al. |
| 7,335,557 | B2 | 2/2008 | Yoshida et al. |
| 7,679,373 | B2 * | 3/2010 | Taki et al. ................... 324/550 |
| 2003/0210588 | A1 | 11/2003 | Fukuda et al. |

FOREIGN PATENT DOCUMENTS

| JP | 11-273373 | 10/1999 |
| JP | 2006-344793 | 12/2006 |
| JP | 2007-28898 | 2/2007 |

* cited by examiner

*Primary Examiner*—Tan T. Nguyen
(74) *Attorney, Agent, or Firm*—Dickstein Shapiro LLP

(57) ABSTRACT

A semiconductor device includes plural switching transistors configured to perform trimming for characteristic adjustment of the semiconductor device, and a nonvolatile memory connected to the plural switching transistors and configured to store data for determining ON and OFF of the plural switching transistors. When the semiconductor device is in operation, ON and OFF of the switching transistors are determined by the data.

6 Claims, 4 Drawing Sheets

MEMORY CONTROL CIRCUIT AND SEMICONDUCTOR DEVICE

BACKGROUND OF THE INVENTION

1. Field of the Invention

The present invention relates to a semiconductor device which allows characteristic adjustment to be performed after being packaged.

2. Description of the Related Art

Normally, a fuse made of poly-silicon is provided beforehand to a power source IC (Integrated Circuit), such as a voltage regulator or an AC/DC converter for performing characteristic adjustment of the IC. In order to fabricate an IC product (final IC product) having specifications requested by a user, a prefabricated IC wafer (an IC in a wafer state) has its characteristics measured after specifications of the IC product are decided and undergoes a trimming process in which a fuse provided to the IC wafer is suitably cut by a laser device based on the measured characteristics of the IC wafer. By performing the trimming process, characteristics of the IC such as output voltage are adjusted to match the specifications requested by the user (characteristic adjustment).

In the above method, since the characteristic adjustment is performed when the IC is in a wafer state, characteristics of the IC wafer may shift (characteristic shift) after the IC wafer is assembled as a package (packaging). In addition, since the IC fabrication operation using the above-described method requires performing a wafer test, a trimming process, a packaging process, and a final test, the IC fabrication operation becomes long. It is, therefore, desired to perform characteristic adjustment after the IC wafer is packaged.

Japanese Laid Open Patent Application No. 11-273373 discloses a non-volatile memory integrated circuit for storing analog signals along with retrieving the stored analog signals and reading out the retrieved analog signals.

Japanese Laid Open Patent Application No. 2007-028898 discloses a battery package which is safe, and seldom suffers from troubles of FET or breaking of the current fuse even when an ON-state resistance of a control FET becomes small.

SUMMARY OF THE INVENTION

The present invention may solve one or more problems of the related art.

A preferred embodiment of the present invention may provide a semiconductor device and a memory control circuit without unnecessary members and terminals and allowing characteristic adjustment to be performed after being packaged.

According to a first aspect of the present invention, there is provided a semiconductor device, including: plural switching transistors configured to perform trimming for characteristic adjustment of the semiconductor device; and a nonvolatile memory connected to the plural switching transistors and configured to store data for determining ON and OFF of the plural switching transistors; wherein when the semiconductor device is in operation, ON and OFF of the switching transistors are determined by the data.

According to a second aspect of the present invention, there is provided a memory control circuit used for semiconductor device including plural of switching transistors configured to perform trimming for characteristic adjustment of the semiconductor device and a nonvolatile memory connected to the switching transistors and configured to store data for determining ON and OFF of the plural switching transistors, the ON and OFF of the plural switching transistors being determined by the data when the semiconductor device is in operation, the memory control circuit including: a test terminal; and a shift register connected to the test terminal and the nonvolatile memory; wherein one or more bits of the shift register are used as a mode switching flag for switching between a data input mode of inputting data to be written into the nonvolatile memory, and a high voltage application mode of writing data into the nonvolatile memory, and the input of data to be written into the nonvolatile memory, input of data transfer clock, and the high voltage application for writing data into the nonvolatile memory are performed by using the test terminal.

As an embodiment, one or more bits of the nonvolatile memory are used as flag bits for starting a mode of writing data into the nonvolatile memory, immediately after the semiconductor device is powered ON or a chip-enabled terminal of the semiconductor device is active, data stored in the nonvolatile memory is read out, when data are not written in the flag bits, the mode of writing in the nonvolatile memory starts, and when data are written in the flag bits, writing in the nonvolatile memory starts is not performed.

As an embodiment, the shift register further includes a bit indicating an address in the nonvolatile memory, and a bit indicating data to be written in the nonvolatile memory, a bit indicating an address in the nonvolatile memory, and the one or more bits as the mode switching flag.

As an embodiment, one or more bits of the nonvolatile memory are set to be writable, and other one or more bits of the nonvolatile memory are set to be un-writable, immediately after the semiconductor device is powered ON or the chip-enabled terminal of the semiconductor device is active, the reading out of the data stored in the nonvolatile memory continues until both the writable bits and the un-writable bits are read out.

As an embodiment, the memory control circuit further includes a Vpp switching circuit that detects that the mode switching flag becomes 1, indicating that data required by the shift register has been input, and set the test terminal to be in the high voltage application mode.

According to the above embodiments, it is possible to provide a semiconductor device and a memory control circuit allowing characteristic adjustment to be performed after being packaged, and without unnecessary members and terminals.

These and other objects, features, and advantages of the present invention will become more apparent from the following detailed description of preferred embodiments given with reference to the accompanying drawings.

DESCRIPTION OF THE PREFERRED EMBODIMENTS

Below, preferred embodiments of the present invention are explained with reference to the accompanying drawings.

<Overall Configuration>

Figure 1:
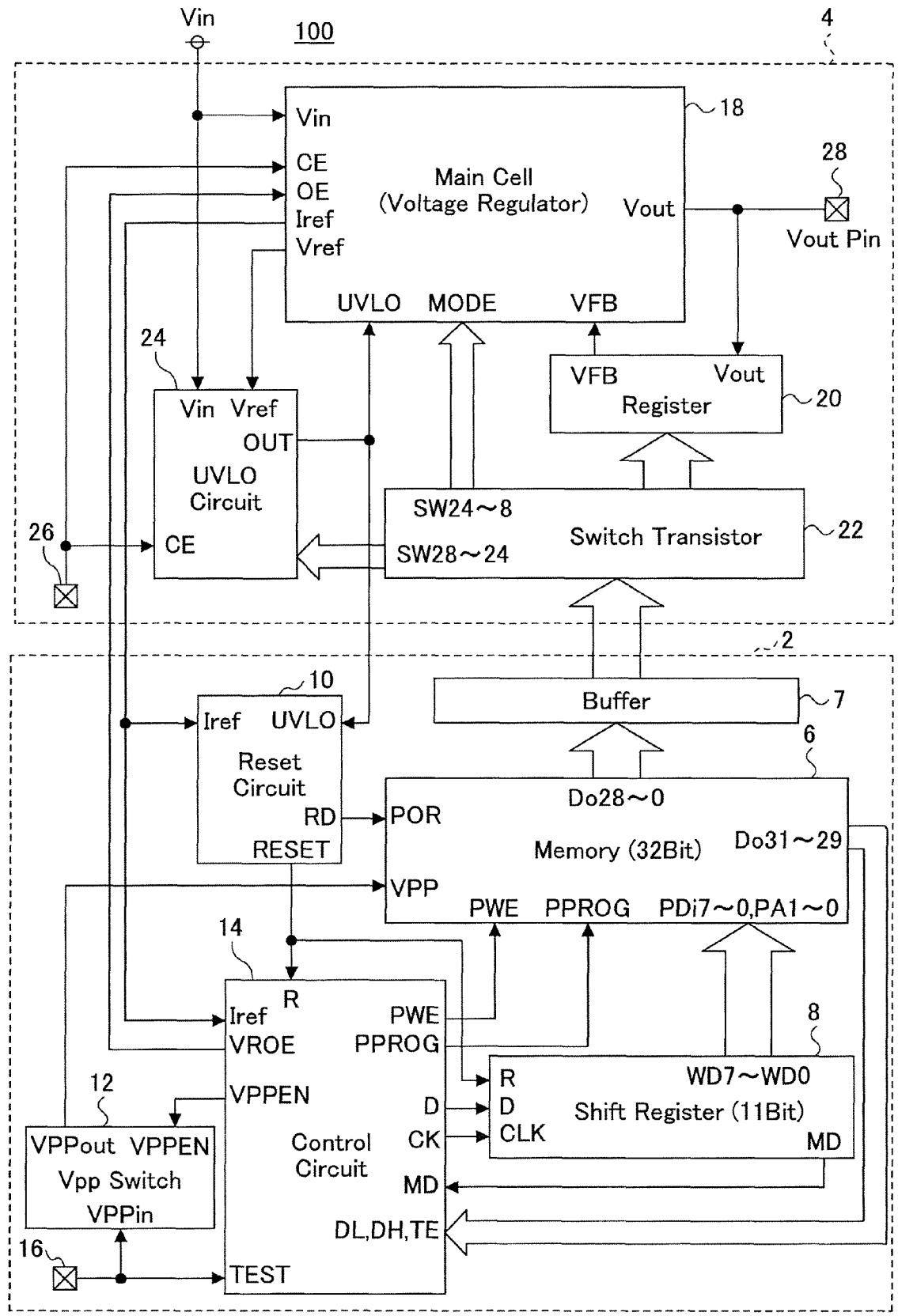
FIG. 1 is a block diagram illustrating a semiconductor device allowing characteristic adjustment after packaging according to an embodiment of the present invention.

FIG. 1 is a block diagram illustrating a semiconductor device 100 allowing characteristic adjustment after package according to an embodiment of the present invention.

As shown in FIG. 1, the semiconductor device 100 includes a user block 4 and a fuse memory block (memory control circuit) 2.

The user block 4 includes a main cell 18, which is a main component of the semiconductor device 100, such as a power source IC. In the present embodiment, for example, the main cell 18 is a voltage regulator (VR). In addition, the user block 4 includes a register 20, a switching transistor section 22, a UVLO (Under Voltage Lock Out) circuit 24, and a CE (Chip-Enabled) terminal 26. The UVLO circuit 24 stops operations when the applied voltage is lower than a given value, thereby preventing malfunction.

The switching transistor section 22 includes plural switching transistors (not illustrated), and these switching transistors are switched ON and OFF according to data stored in a memory 6 of the fuse memory block 2, as described below, and due to this configuration, characteristics of the user block 4, especially, the main cell 18, are adjusted. As shown in FIG. 1, these switching transistors are connected to the main cell 18, the UVLO circuit 24, the register 20, and other components.

The fuse memory block (memory control circuit) 2 includes a memory 6, which is, for example, a one-time programmable (OTP) memory, a shift register 8, a reset circuit 10, a Vpp switching circuit 12, a control circuit 14, a test terminal 16, and a buffer 7.

The memory 6 stores the data for determining to switching ON and switching OFF each of the switching transistors in the switching transistor section 22. The data stored in the memory 6 is read out and stored in the buffer 7 immediately after the semiconductor device 100 of the present embodiment is powered ON or immediately after the CE terminal 26 of the semiconductor device 100 is active, and is used to control ON and OFF of the switching transistors in the switching transistor section 22.

The shift register 8 temporarily stores data input from the test terminal 16, which data are sequentially to be written to the memory 6.

The control circuit 14 primarily controls writing data from the shift register 8 to the memory 6, and signals related to overall operations of the fuse memory block 2.

Below, operations of components of the fuse memory block 2 are described.

<Memory 6>

The memory 6 of the present embodiment is a nonvolatile memory, and is a 32-bit one-time programmable (OTP) memory. The memory map of the memory 6 is shown in Table 1.

TABLE 1

| Bit 31 | Bit 30 | Bit 29 | Bit 28 to Bit 0 |
|---|---|---|---|
| DH | DL | TEB | USER AREA |

"DH" indicates that data "1" is written, "DL" indicates that data "0" is written. The "1" and "0" data are used for specifying the time for reading the memory 6. As described below, until both DH and DL are read out, the operation of reading data from the memory 6 continues, that is, a memory read signal (as described below) is output continuously.

The "TEB" in the Bit 29 is used for setting a mode of writing the memory 6. Specifically, the memory 6 is an OTP memory, and when TEB is "0", the OTP memory 6 is in a writing mode, and when TEB is "1", the OTP memory 6 is in a protected mode. Until TEB is set to be "1", the OTP memory 6 is in the writing mode, and it is allowed to write additional data to the OTP memory 6. Preferably, the value "1" of TEB is electrically-un-erasable, and UV (Ultra-violet rays)-erasable.

The 29 bits from Bit 28 to Bit 0 store fuse data. For example, Bit 28 to Bit 0 are "0" initially, and are maintained to be "1" after being written.

<Shift Register 8>

The shift register 8 of the present embodiment temporarily stores data input from the test terminal 16, which data are sequentially to be written to the memory 6. The shift register 8 writes data into the memory 6 in units of 8 bits. Due to this, the shift register 8 also stores two-bit memory address data indicating which 8 bits of the memory 6 are to be written. The memory map of the shift register 8 is shown in Table 2.

TABLE 2

| Bit 10 | Bit 9 | Bit 8 | Bit 7 | Bit 6 | Bit 5 | Bit 4 | Bit 3 | Bit 2 | Bit 1 | Bit 0 |
|---|---|---|---|---|---|---|---|---|---|---|
| A1 | A0 | D7 | D6 | D5 | D4 | D3 | D2 | D1 | D0 | MD |

"D7" to "D0" of Bit 8 to Bit 1 are data to be written. "A1" and "A0" of Bit 10 and Bit 9 are address data indicating which one of a quarter of Bit 28 to Bit 0 of the memory 6 is to be written. For example, Bit 0 to Bit 7 of the memory 6 has an address 00, namely, A1=0, A0=0, Bit 8 to Bit 15 of the memory 6 has an address 01, namely, A1=0, A0=1, Bit 16 to Bit 23 of the memory 6 has an address 10, namely, A1=1, A0=0, and Bit 24 to Bit 27 of the memory 6 has an address 11, namely, A1=1, A0=1.

"MD" of Bit 0 is used for indicating setting of the mode of applying Vpp during writing. Namely, when Bit 0 is 1, data input from the test terminal 16 is forbidden, that is, a Vpp application mode starts, and for example, a writing pulse of 7.5 V and 100 µsec is applied as Vpp, and is written into the memory 6. Because the register 8 is a shift register, as described below with reference to FIG. 3, when the leading pulse of a TEST waveform is stored in Bit 0, the Vpp application mode starts.

When Bit 0 is 0, since data input to the shift register 8 is forbidden, it is necessary to turn off the power to finish the Vpp application mode each time the shift register 8 writes 8-bit data to the memory 6.

<Reset Circuit 10>

Immediately after the semiconductor device 100 of the present embodiment is powered ON or immediately after the CE terminal 26 of the semiconductor device 100 is active (refer to "Input VIN" in FIG. 2), once termination caused by UVLO is released, the reset circuit 10 outputs a system reset signal (RESET). In addition, the reset circuit 10 outputs memory read signal RD, which is later than the system reset signal by a few µsec. Therefore, the data stored in the memory 6 are read out (refer to "Input RD, Output VRCE, DOi" in FIG. 2, Here, i=0 to 28).

Further, the reset circuit 10 maintains the RD signal at a high level until the "1" and "0" data written in Bit 31 "DH" and Bit 30 "DL" in the memory 6 are read out. This prevents erroneous reading from the memory 6.

Note that data to be assigned to the switching transistor section 22 is uncertain until reading data from the memory 6 is finished. For this reason, as described below, until reading data from the memory 6 is finished, the control circuit 14 sets a VROE signal, which enables an output Vout from the voltage regulator (VR) 18, at a low level to prevent malfunction of the user block 4 (refer to "Output VROE" in FIG. 2).

<Vpp Switching Circuit 12>

As shown in FIG. 1, in the semiconductor device 100 of the present embodiment, usually, a voltage Vin is output, the Vpp switching circuit 12 applies the voltage Vpp from the test terminal 16 only when a VPPEN signal appears.

<Control Circuit 14>

As described above, immediately after the semiconductor device 100 of the present embodiment is powered ON or immediately after the CE terminal 26 of the semiconductor device 100 is active, the data stored in the memory 6 is read out, and at this time, if "TEB" of the memory 6 has already been "1" ("H"), data writing in the memory 6 is not performed.

Figure 2:
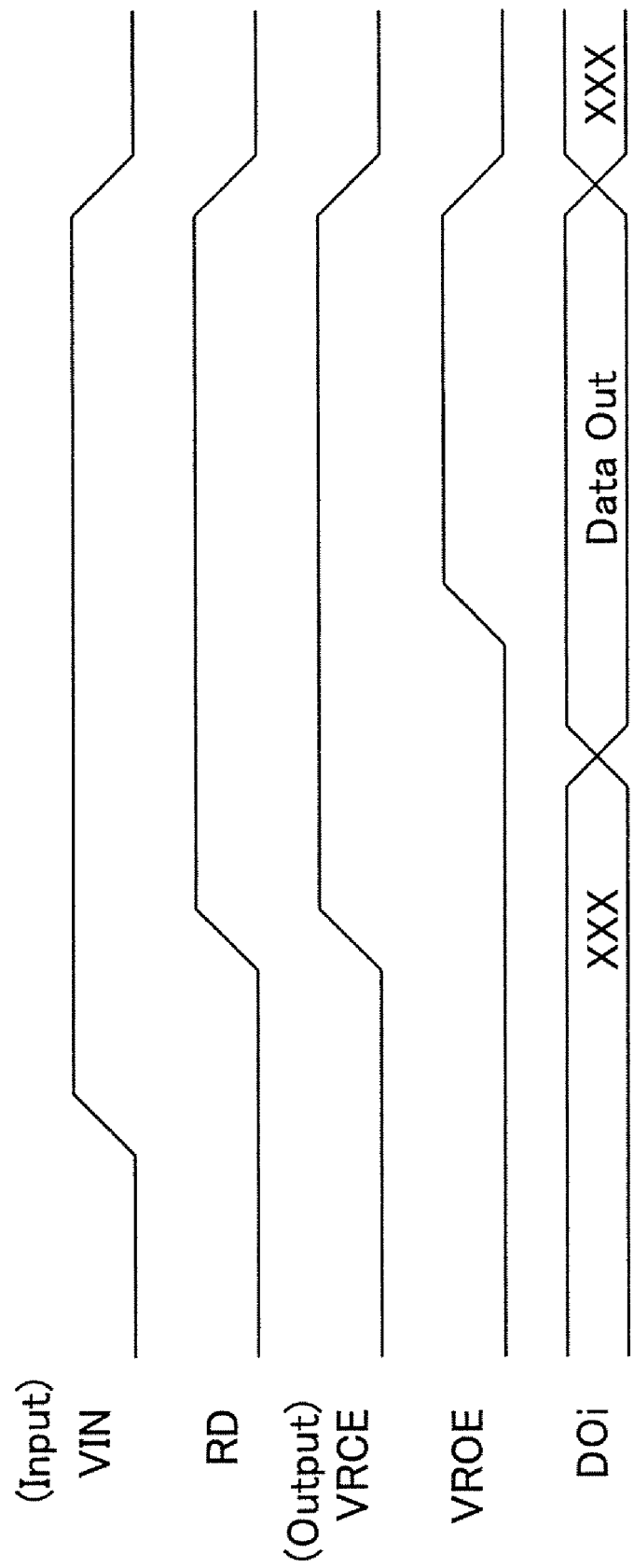
FIG. 2 illustrates examples of input and output waveforms in a usual mode in the present embodiment.

FIG. 2 illustrates examples of input and output waveforms in a usual mode in the present embodiment.

On the other hand, if "TEB" of the memory 6 is still "0" ("L"), the memory 6 is in the writing mode.

Figure 3:
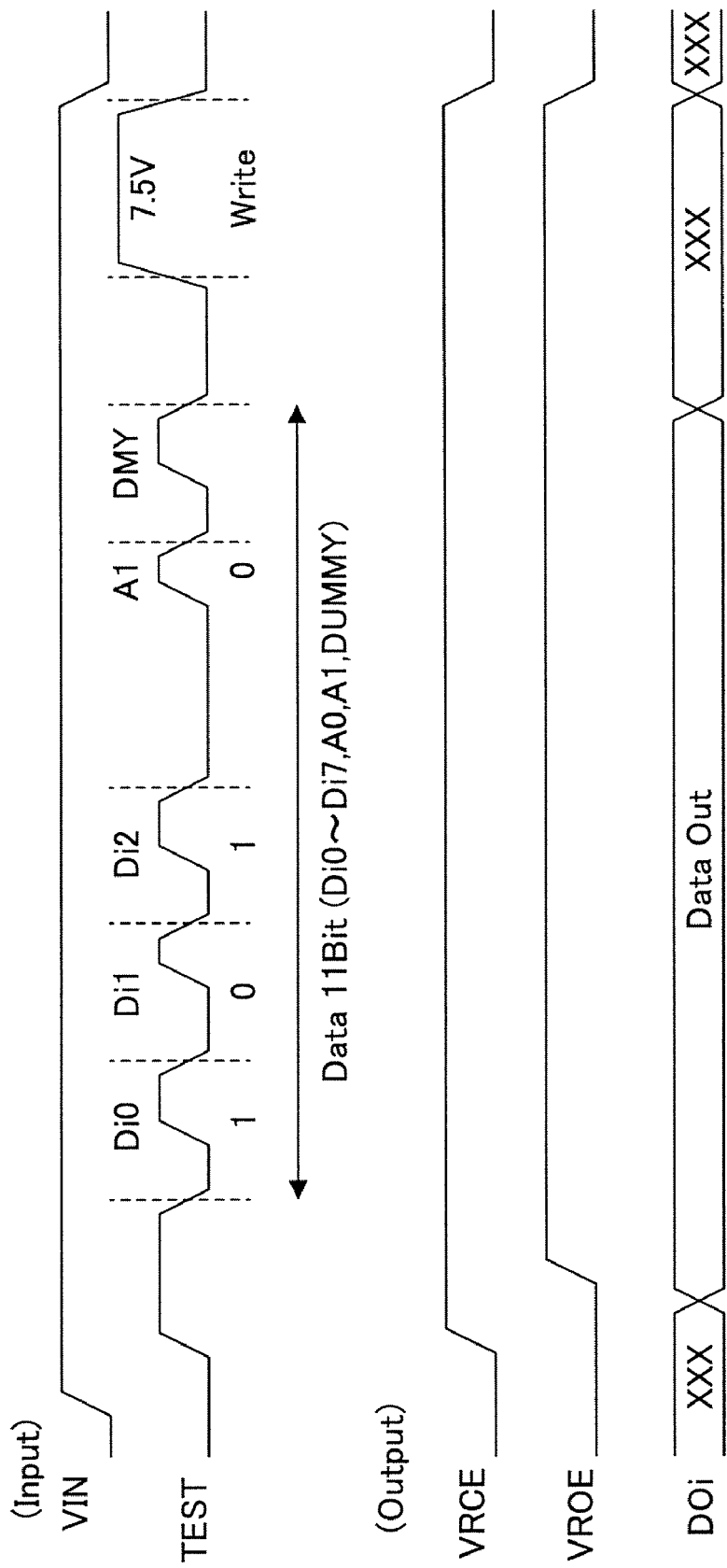
FIG. 3 illustrates examples of input and output waveforms in the memory writing mode in the present embodiment.

FIG. 3 illustrates examples of input and output waveforms in the memory writing mode in the present embodiment.

In the state shown in FIG. 3, that is, a TEST signal as shown in FIG. 3 is input, data is input the test terminal 16 in a "data input mode" or a "Vpp application mode".

<Data Input Mode>

In the data input mode, the control circuit 14 receives a signal (TEST) from the test terminal 16. At this time, when the width of the high level (H) of the input pulse is large, the pulse is regarded to be "1", and when the width of the high level (H) of the input pulse is small, the pulse is regarded to be "0", and the signal is taken in synchronization with the falling time. Here, the synchronization functions as a data transfer clock. Further, the control circuit 14 input the signal (data) of 11 bits into the shift register 8 (2-bit address, 8-bit data) (refer to "Input TEST" in FIG. 3), and when the MD signal becomes the high level (namely, when the leading pulse of the TEST waveform is stored in Bit 0), reception of additional data is forbidden, and the devices transits to the next Vpp application mode.

<Vpp Application Mode>

In the Vpp application mode, a writing pulse of 7.5 V and 100 µsec is applied to the test terminal 16 (refer to "Input TEST" in FIG. 3), thus, the data is written from the shift register 8 to memory 6. Next, in order to stop the Vpp application mode and change to the data input mode, it is necessary to turn off the power source (Vin).

Since the shift register 8 writes data into the memory 6 in units of 8 bits, in order to write all bits (29 bits) of the memory 6, the above operations in the data input mode and the Vpp application mode need be repeated four times.

(Example Using Memory Control Circuit)

Figure 4:
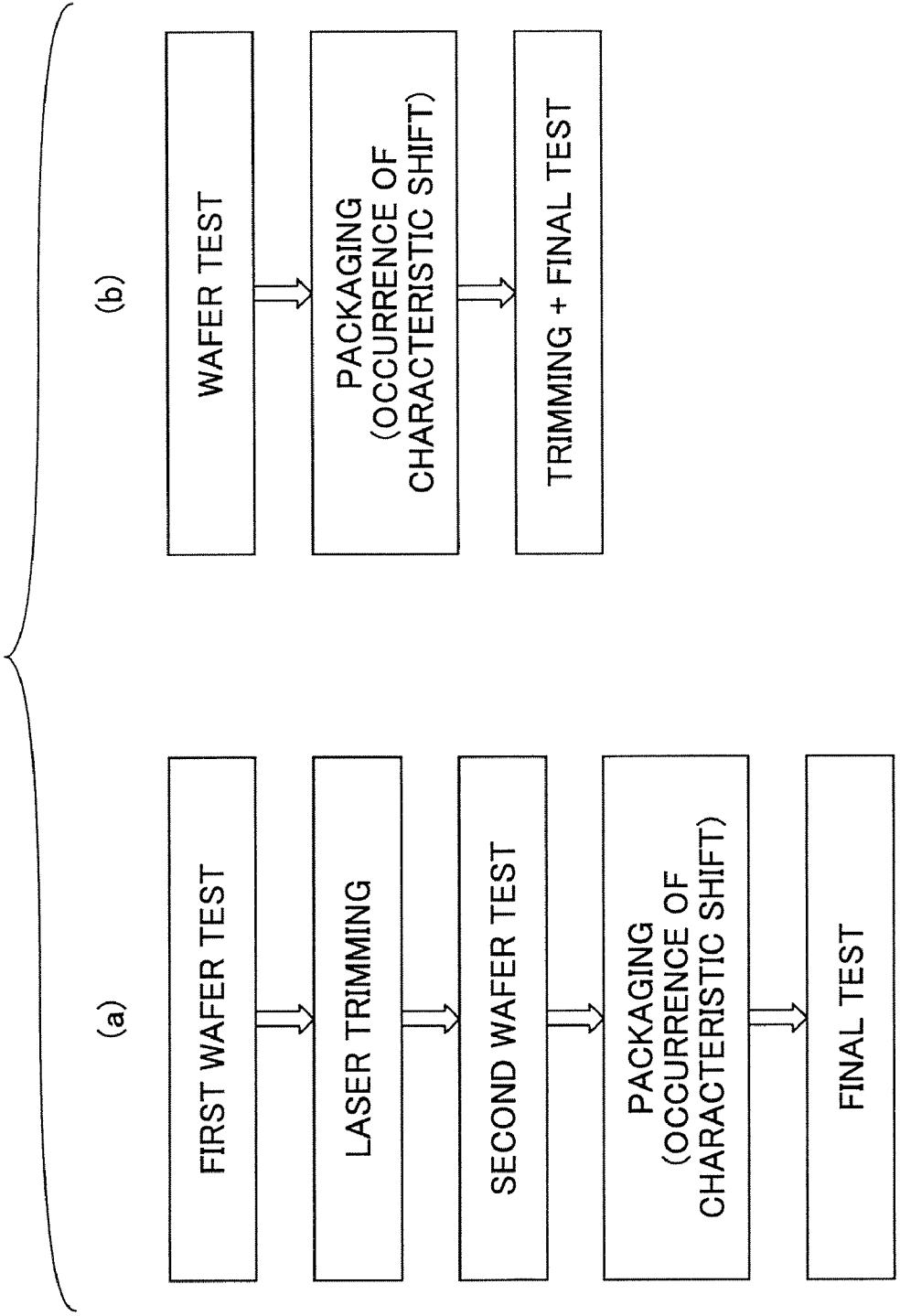
FIG. 4 is a schematic drawing for describing a characteristic adjustment operation using a poly-silicon fuse according to a comparative example and a characteristic adjustment operation using a memory control circuit according to an embodiment of the present invention.

According to a common characteristic adjustment operation where a typical poly-silicon fuse is used as illustrated in (a) of FIG. 4, a first wafer test is performed on an IC (integrated chip) being in a wafer state. Then, trimming conditions are determined based on data obtained by the IC wafer test 1. Then, characteristic adjustment is performed by trimming (cutting) the fuse with a laser trimming apparatus according to the determined trimming conditions. Then, a second wafer test is performed on the trimmed IC wafer for checking the result of the trimming. Then, the trimmed IC wafer undergoes a packaging process. Then, a final test is performed on the packaged IC.

Because the trimming process for characteristic adjustment is already finished before a packaging process, stress or the like that is applied during the packaging process may cause characteristics of the final IC product to shift. Due to the shift of characteristics, the final IC product is unable to exhibit a satisfactory precision at the final test performed after the packaging process.

On the other hand, with a characteristic adjustment operation illustrated in (b) of FIG. 4 using the control circuit 14 with the test terminal 16 according to an embodiment of the present invention, a trimming process for characteristic adjustment can be performed substantially at the same time of performing a final test after a packaging process. Therefore, characteristic adjustment can be performed with consideration of characteristic shift caused by stress or the like applied to the IC during the packaging process. Thereby, the final IC product is able to exhibit satisfactory precision.

According to the control circuit 14 of the above-described embodiment of the present invention, no additional special terminal is needed for memory writing. Thus, it is possible to perform switching of modes (e.g., regular mode, memory writing mode, data input mode, Vpp application mode), data input, and application of writing voltage by using a single terminal (test terminal 16). Further, a data transfer clock can be input from the test terminal 16.

With the above-described embodiment of the memory control circuit 2, a series of processes including measuring data for trimming, calculating trimming values for characteristic adjustment, and writing trimming data to the memory can be performed substantially together at the same time of performing a final test for testing a packaged IC product (IC product obtained after a packaging process) by using the test terminal 16. Therefore, even in a case where characteristic shift due to stress or the like occurs during a packaging process, a trimming operation for characteristic adjustment is performed with consideration of characteristic shift when performing a final test on a packaged IC product. This improves precision of characteristic adjustment compared to performing a trimming process on an IC in a wafer state.

Furthermore, an IC fabrication operation can be significantly shortened by preparing an IC in a packaged state beforehand and using the memory control circuit 2 for performing a trimming process in a final testing process of the IC package. Furthermore, since the trimming is performed by electric trimming with the test terminal 16 during the final test, there is no need to prepare dedicated equipment (e.g., laser trimmer) as a trimming operation using a poly-silicon fuse.

While the present invention is described with reference to specific embodiments chosen for purpose of illustration, it should be apparent that the invention is not limited to these embodiments, but numerous modifications could be made thereto by those skilled in the art without departing from the basic concept and scope of the invention.

This patent application is based on Japanese Priority Patent Application No. 2007-243341 filed on Sep. 20, 2007, the entire contents of which are hereby incorporated by reference.

What is claimed is:

1. A semiconductor device, comprising:
a plurality of switching transistors configured to perform trimming for characteristic adjustment of the semiconductor device; and
a nonvolatile memory connected to the plural switching transistors and configured to store data for determining ON and OFF of the plural switching transistors;
wherein when the semiconductor device is in operation, ON and OFF of the switching transistors are determined by the data.

2. A memory control circuit used for semiconductor device including a plurality of switching transistors configured to perform trimming for characteristic adjustment of the semiconductor device and a nonvolatile memory connected to the switching transistors and configured to store data for determining ON and OFF of the plural switching transistors, the ON and OFF of the plural switching transistors being determined by the data when the semiconductor device is in operation, the memory control circuit comprising:
a test terminal; and
a shift register connected to the test terminal and the nonvolatile memory;
wherein one or more bits of the shift register are used as a mode switching flag for switching between a data input mode of inputting data to be written into the nonvolatile memory, and a high voltage application mode of writing data into the nonvolatile memory, and the input of data to be written into the nonvolatile memory, input of data transfer clock, and the high voltage application for writing data into the nonvolatile memory are performed by using the test terminal.

3. The memory control circuit as claimed in claim 2, wherein one or more bits of the nonvolatile memory are used as flag bits for starting a mode of writing data into the nonvolatile memory, immediately after the semiconductor device is powered ON or a chip-enabled terminal of the semiconductor device is active, data stored in the nonvolatile memory is read out, when data are not written in the flag bits, the mode of writing in the nonvolatile memory starts, and when data are written in the flag bits, writing in the nonvolatile memory starts is not performed.

4. The memory control circuit as claimed in claim 3, wherein one or more bits of the nonvolatile memory are set to be writable, and other one or more bits of the nonvolatile memory are set to be un-writable, immediately after the semiconductor device is powered ON or the chip-enabled terminal of the semiconductor device is active, the reading out of the data stored in the nonvolatile memory continues until both the writable bits and the un-writable bits are read out.

5. The memory control circuit as claimed in claim 2, wherein the shift register further includes a bit indicating an address in the nonvolatile memory, and a bit indicating data to be written in the nonvolatile memory, a bit indicating an address in the nonvolatile memory, and the one or more bits as the mode switching flag.

6. The memory control circuit as claimed in claim 2, further includes a Vpp switching circuit that detects that the mode switching flag becomes 1, indicating that data required by the shift register has been input, and set the test terminal to be in the high voltage application mode.

* * * * *